United States Patent [19]
Dolby

[11] Patent Number: 4,498,060
[45] Date of Patent: Feb. 5, 1985

[54] CIRCUIT ARRANGEMENTS FOR MODIFYING DYNAMIC RANGE USING SERIES ARRANGED BI-LINEAR CIRCUITS

[76] Inventor: Ray M. Dolby, 50 Walnut St., San Francisco, Calif. 94118

[21] Appl. No.: 591,575

[22] Filed: Mar. 20, 1984

Related U.S. Application Data

[63] Continuation of Ser. No. 325,529, Dec. 1, 1981, abandoned, which is a continuation-in-part of Ser. No. 300,741, Sep. 10, 1981, which is a continuation-in-part of Ser. No. 292,958, Aug. 14, 1981, abandoned, and Ser. No. 275,382, Jun. 19, 1981, abandoned, and Ser. No. 275,205, Jun. 19, 1981, abandoned, and Ser. No. 275,204, Jun. 19, 1981, abandoned, and Ser. No. 180,771, Aug. 22, 1980, abandoned, and Ser. No. 163,950, Jun. 30, 1980, abandoned.

[51] Int. Cl.$^3$ ............................................. H04B 1/64
[52] U.S. Cl. ...................................... 333/14; 381/106

[58] Field of Search ........................... 333/14; 455/72; 381/106

[56] References Cited

U.S. PATENT DOCUMENTS 3,737,678  6/1973  Dolby et al. .
3,810,035  5/1974  Gundry .
3,818,244  6/1974  Dolby et al. .

Primary Examiner—Paul Gensler
Attorney, Agent, or Firm—Majestic, Gallagher, Parsons & Siebert

[57] ABSTRACT

Circuit arrangements for cross-coupling series connected bi-linear compressors and expanders are disclosed including the coupling of signal path signal components in one circuit to a signal path in another circuit, the coupling of control circuit signal components in one circuit to a control circuit in another circuit and cross-coupling by way of employing a common control circuit for series connected devices.

14 Claims, 16 Drawing Figures

CIRCUIT ARRANGEMENTS FOR MODIFYING DYNAMIC RANGE USING SERIES ARRANGED BI-LINEAR CIRCUITS

This application is a continuation of my copending (now abandoned) U.S. patent application Ser. No. 325,529, filed Dec. 1, 1981. Said application and the present application are continuations-in-part of my prior copending U.S. patent application Ser. No. 300,741, filed Sept. 10, 1981, which is in turn a continuation-in-part of my now abandoned U.S. patent applications Ser. No. 292,958, filed Aug. 14, 1981; Ser. No. 275,382, filed June 19, 1981; Ser. No. 275,205, filed June 19, 1981; Ser. No. 275,204, filed June 19, 1981; Ser. No. 180,771, filed Aug. 22, 1980; and Ser. No. 163,950, filed June 30, 1980.

The present invention is concerned in general with circuit arrangements which alter the dynamic range of audio and other signals, namely compressors which compress the dynamic range and expanders which expand the dynamic range. Generally, it relates to improvements in compressors and expanders that comprise series connected circuits and more particularly to the cross-coupling of such series circuits.

Compressors and complementary expanders are often used together (a compander system) to effect noise reduction; the signal is compressed before transmission or recording and expanded after reception or playback from the transmission channel. However compressors may be used alone to reduce the dynamic range, e.g. to suit the capacity of a transmission channel, without subsequent expansion when the compressed signal is adequate for the end purpose. In addition, compressors alone are used in certain products, especially audio products which are intended only to transmit or record compressed broadcasts or pre-recorded signals. Expanders alone are used in certain products, especially audio products which are intended only to receive or play back already compressed broadcasts or pre-recorded signals. In certain products, particularly audio recording and play back products, a single device is often configured for switchable mode operation as a compressor to record signals and as an expander to play back compressed broadcasts or pre-recorded signals.

The amount of compression or expansion may be expressed in dB. For example, 10 dB of compression means that an input dynamic range of N dB is compressed to an output range of (N−10) dB. In a noise reduction system 10 dB of compression followed by 10 dB of complementary expansion is said to provide 10 dB of noise reduction.

The present invention relates in particular to improvements in circuit arrangements for modifying the dynamic range of an input signal, which circuit arrangements comprise series circuits, each with a bi-linear characteristic (where "linear" in this context denotes constant gain) composed of:

(1) a low level linear portion up to a threshold,
(2) an intermediate level non-linear (changing gain) portion, above the threshold and up to a finishing point, providing a predetermined maximum compression ratio or expansion ratio, and
(3) a high level linear portion having a gain different from the gain of the low level portion.

The characteristic is denoted a bi-linear characteristic because there are two portions of substantially constant gain.

In practice, the threshold and finishing point are not always well defined "points". The two transition regions where the intermediate level portion merges into the low level and high level linear portions can each vary in shape from a smooth curve to a sharp curve, depending on the control characteristics of the compressor and expander.

It is also pointed out that circuit arrangements with bi-linear characteristics are distinguished from two other known classes of circuit arrangement, namely:

(a) a logarithmic or non-linear circuit arrangement with either a fixed or changing slope and with no linear portion: the gain changes over the whole dynamic range.

(b) circuit arrangements with a characteristic having two or more portions of which only one portion is linear ("uni-linear").

A circuit arrangement with a bi-linear characteristic has particular advantages and is widely used. The threshold can be set above the input noise level or transmission channel noise level in order to exclude the possibility of control of the circuit by noise. The high level portion of substantially constant gain avoids non-linear treatment of high level signals which would otherwise introduce distortion. Moreover, in the case of an audio signal, for which the circuit must be syllabic, the high level portion provides a region within which to deal with the overshoots which occur with a syllabic circuit when the signal level increases abruptly. The overshoots are suppressed by clipping diodes or similar means. Only bi-linear characteristics are capable of providing this combination of advantages.

Known circuits employing a single stage with a bi-linear characteristic in use today in consumer audio products provide 10 dB of compression and expansion, which is adequate for many purposes. However, this leaves some noise audible to some listeners and, for highest fidelity, more compression and expansion is desirable, say 20 dB. A new circuit now also in use for consumer audio products is described in my co-pending U.S. Application Ser. No. 300,741 and in Belgian Pat. No. 889,428, Belgian Pat. No. 889,427, Belgian Pat. No. 889,426, Audio, May, 1981, pp 20–26 and in paper J-6 and preprint presented at November, 1981 Convention, Audio Engineering Society, New York, N.Y.

Prior to the above-mentioned circuits, circuits were known and commercially available which provided 20 dB of compression or expansion, and even more, but these were usually constant slope logarithmic circuit arrangements in which there is a constantly changing gain over the whole dynamic range or nearly the whole dynamic range. Such circuits suffer from higher distortion and signal tracking problems at very low and very high signal levels than the bi-linear circuits in which the change of gain is restricted to an intermediate portion of the characteristic and overshoot problems are more severe than with bi-linear characteristic arrangements. Known constant slope companders employ compression ratios in the range 1.5:1, 2:1 and 3:1, but 2:1 is most common.

According to the staggering aspect of the bi-linear circuits described in Belgian Pat. No. 889,428, a first circuit, which has a bi-linear input-output characteristic, is followed by one or more further circuits which also have bi-linear characteristics at any given frequency within a frequency range common to the circuits. The thresholds and dynamic regions of the circuits are set to different values so as to stagger the intermediate level portions of the characteristics of the circuits to produce a change of gain over a wider range of intermediate input levels than for any of the circuits individually, and to produce an increased difference between the gains at low and high input levels, but with a maximum compression or expansion ratio which is substantially no greater than the maximum compression ratio of any single circuit, by virtue of the staggering.

In the case of audio circuits, if the circuits have overshoot suppression (limiting) elements, then it is also possible to stagger their thresholds along with the stagger of the syllabic thresholds. The overshoots of the lower level circuits, or stages, are correspondingly reduced, with minimal overall overshoot of the several stages. This is in contrast to conventional logarithmic compressors in which large overshoots are inherently produced.

Each of the circuits may introduce an alteration of the spectral content of the signal—for example, a low level treble boost in the case of a compressor. Thus each succeeding stage may be actuated by a signal of progressively changing spectral content. In the case of complex signals, this has the virtue of spectrally spreading out the chances for error in the decoding function. In the case of a tape recorder with an uneven frequency response characteristic, for example, the spectral shifting tendency reduces the overall dynamic and frequency response errors of the decoded result.

The ability to stagger bi-linear stages provides the designer with an additional way in which to optimize an overall circuit. In so doing, the shapes of the compression characteristics of individual stages can be designed with staggering specifically in mind. The transient characteristics of the circuits are also taken into account and the opportunity is preferably taken to stagger the overshoot suppression thresholds in audio compressors and expanders so as to result in minimal overall overshoot.

A well known type of circuit, called "sliding band", which can be used for each of the first and second circuits, creates the specified desirable characteristic for the case of high frequency audio compression or expansion by applying high frequency boost (for compression) or cut (for expansion) by way of a high pass filter with a variable low corner frequency. As the signal level in the high frequency band increases, the filter corner frequency slides upwardly so as to narrow the boosted or cut band and exclude the useful signal from the boost or cut. Examples of such circuits are to be found in U.S. Pat. Re. No. 28,426, U.S. Pat. No. 3,757,254, U.S. Pat. No. 4,072,914, U.S. Pat. No. 3,934,190 and Japanese Patent Applicaton No. 55529/71.

Accordingly, each of the first and second circuits can be such a "sliding band" circuit. In principle the quiescent corner frequencies of the two sliding band circuits can be different and use can be made of this to provide a degree of compression or expansion which is higher in one part of the treated frequency band than in another. However, in a modification the corner frequencies are made substantially identical. This leads to the advantage of sharper discriminations between the frequency region where boost or cut is being applied and the region where it is not applied and accordingly a sharper discrimination between the region where noise reduction is no longer taking place, because of the appearance of a significant useful signal, and the region where noise reduction remains effective.

On the other hand, circuits are also well known in which the frequency spectrum is split into a plurality of bands by corresponding band-pass filters and the compression or expansion is effected in each band by a gain control device (whether an automatically responsive, diode type of limiting device or a controlled limiting device) in the case of a compressor, with some form of reciprocal or complementary circuitry for an expander. Examples of such circuits are to be found in U.S. Pat. No. 3,846,719. These split band or multi-band circuits have the advantage of independent action in the various frequency bands and, if this property is required, such circuits may be employed as the first, second, or more stages in the series arrangements.

It is known to construct bi-linear compressors and expanders, of both sliding band and split band type, by the use of only a single signal path. However, it is generally preferred to construct such devices by providing a main signal circuit which is linear with respect to dynamic range, with a combining circuit in the main circuit, and a further circuit which derives its input from the input or output of the further circuit and has its output coupled to the combining circuit. The further circuit includes a limiter (self-acting or controlled) and the limited further circuit signal boosts the main circuit signal in the combining circuit for the case of compression but bucks the main circuit signal for the case of expansion. The limited further path signal is smaller than the main path signal in the upper part of the input dynamic range. The main and further circuits are preferably and most conveniently separately identifiable signal paths.

Such known compressors and expanders are particularly advantageous because they enable the desired kind of transfer characteristic to be established in a precise way without problems of high-level distortion. The low level portion of substantially constant gain is established by giving the further path a threshold above the noise level; below this threshold the further path is linear. The intermediate level portion is created by the region over which the further path limiting action becomes partially effective and the high level portion of substantially constant gain arises after the limiter has become fully effective so that the further path signal ceases to increase and becomes negligible compared to the main path signal. At the highest part of the input dynamic range, the output of the circuit arrangement is effectively only the signal passed by the linear main path, i.e. linear with respect to dynamic range. In dual path audio circuits the provision of overshoot suppression is particularly convenient.

Examples of these known circuits are to be found in U.S. Pat. No. 3,846,719, U.S. Pat. No. 3,903,485 and U.S. Pat. No. Re. 28,426. There are also known analogous circuits which achieve like results but wherein the further path has characteristics inverse to limiter characteristics and the further path output bucks the main path signal for compression and boosts the main path signal for expansion (U.S. Pat. No. 3,828,280 and U.S. Pat. No. 3,875,537).

Any of these known bi-linear circuits may accordingly be employed as the first and second circuits of the series circuit arrangements embodying the invention.

As mentioned previously, it is not essential to create the desired form of bi-linear characteristic by such "dual path" techniques. Alternatives exist, operating with single paths, as described in U.S. Pat. No. 3,757,254, U.S. Pat. No. 3,967,219, U.S. Pat. No.

4,072,914, U.S. Pat. No. 3,909,733 and Japanese Patent Application No. 55529/71, for example. Although these alternative circuits usually are not capable of producing such good results as dual path circuits, or may be less convenient and thereby less economical, they can produce generally equivalent results. Accordingly, these known circuits can also be used as one or more of the circuits of a series circuit arrangement embodying the invention. If desired, one of the first and second circuits can be a dual path circuit and the other a single path circuit.

In the above described staggered series bi-linear circuit arrangements, the series processors operate independently of each other. In accordance with the teachings of the present invention, means for cross-coupling staggered series bi-linear circuits are provided, including the coupling of signal path signal components in one circuit to a signal path in another circuit, the coupling of control circuit signal components in one circuit to a control circuit in another circuit and cross-coupling by way of employing a common control circuit for series connected devices. Cross-coupling may (a) assist in immunizing the system to control by undesired signals, (b) help reduce noise modulation effects, (c) suppress spurious responses, (d) allow relaxation of individual circuit requirements, (e) increase compression or expansion without side effects, (f) reduce overall circuit complexity and cost, etc.

A characteristic of staggered series bi-linear circuits is that they employ different operating thresholds and, usually, different overshoot thresholds (at least in the case of audio devices). Consequently, the circuits respond differently. Cross-coupling of AC signals between (or among) the series circuits provides the system designer with an additional design parameter that may be useful in optimizing the operation of the system.

For example, in the case of dual path bi-linear circuits, the signal output of the noise reduction path of a higher threshold level circuit can be fed to the lower threshold level circuit and injected, with suitable frequency response and phase modifications, into the fixed and variable filter signal circuits, thereby to create active filter actions that enhance the sliding band action and subsequent noise reduction effect.

Similarly, a cross-coupling can be effected between the control signals in series bi-linear circuits to improve the response to rapidly changing signal amplitudes. In one embodiment, a control signal component from the low level circuit (which has the first and largest response to incoming transients, even though it is preferably the second device, because its threshold is reached first when an input signal rises in level) is fed via a coupling network to the control circuit of the high level processor. In this way, the high level processor is provided with a timely warning of impending signal amplitude changes. Such control signal cross-coupling is particularly useful in minimizing overshoots and distortion in series bi-linear audio circuits.

In addition, circuit complexity and cost can be reduced by the use of a single control circuit for two or more stages of series bi-linear circuits, in which case the respective inputs and outputs of the single control circuit are cross-coupled between (or among) the series stages.

The invention will be described in more detail, by way of example, with reference to the accompanying drawings, in which.

Figure 1:
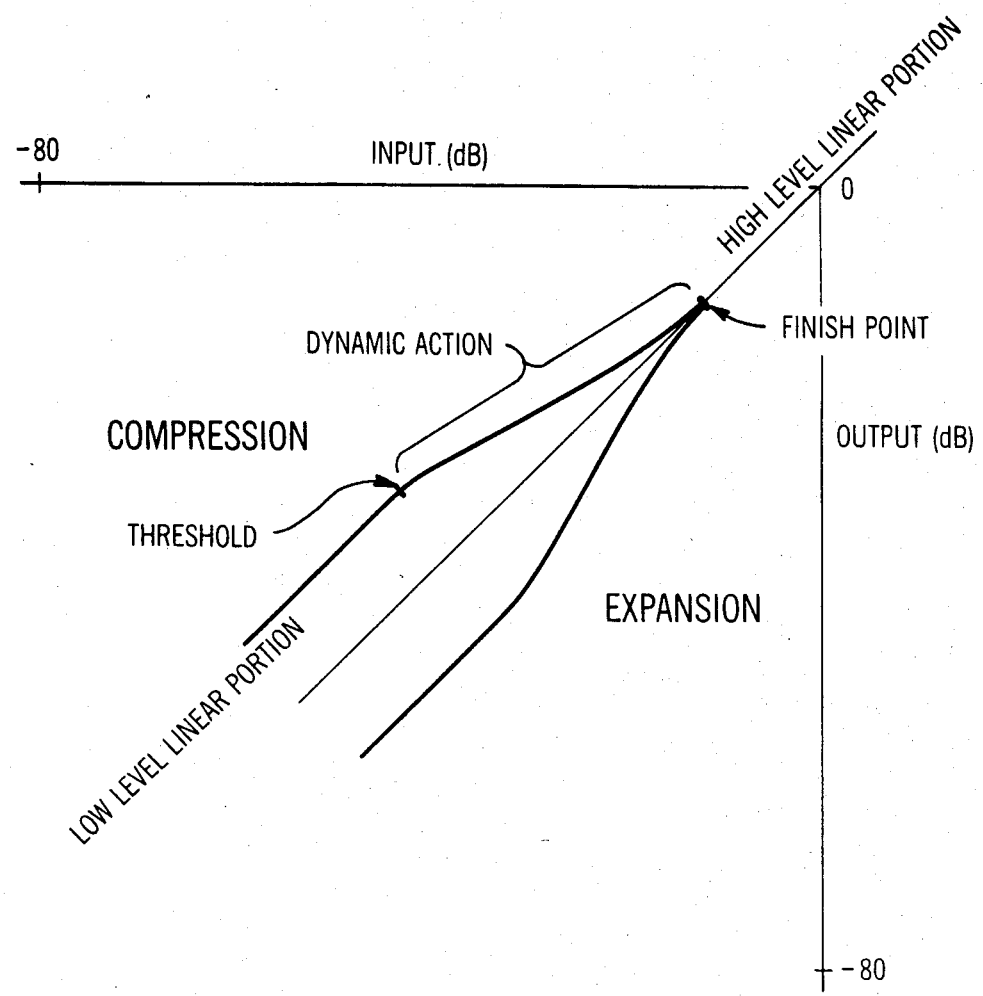
FIG. 1 is an exemplary set of curves showing complementary bi-linear compression and expansion characteristics.

Exemplary bi-linear complementary compression and expansion transfer characteristics (at a particular frequency) are shown in FIG. 1, indicating (for the compression characteristic) the low level portion of substantially constant gain, the threshold, the portion where dynamic action occurs, the finishing point, and the high level portion of substantially constant gain.

Figure 2:
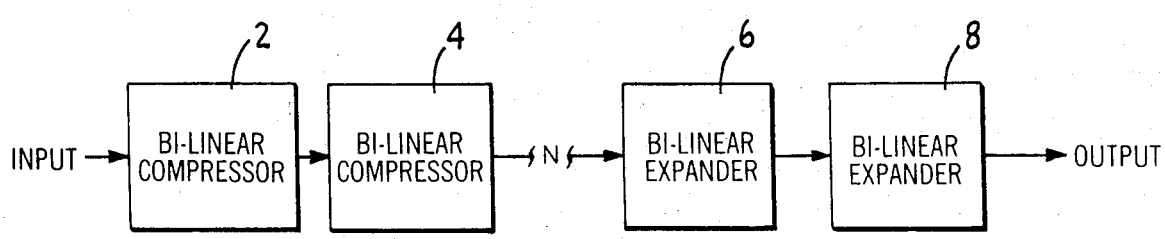
FIG. 2 is a block diagram showing series bi-linear devices in general terms.

FIG. 2 shows series bi-linear devices in general terms: a first bi-linear compressor 2 receives the input information and applies its output to a second bi-linear compressor 4 connected in series, which has its output applied to a noisy information carrying channel N. A pair of series connected bi-linear expanders 6 and 8 receive the input from channel N at expander 6 and provide a noise reduction system output at the output of expander 8. The areas of dynamic action of the series devices are separated or staggered with respect to each other within the frequency range that is common to the devices. Although the figure shows two devices on each side of the information channel N, two or more can be employed: the invention contemplates the cross-coupling of two or more series bi-linear compressors or expanders as explained further hereinafter. When configured as a complementary noise reduction system, like numbers of series bi-linear compressors and expanders are provided.

The order of stages having particular characteristics in the compressor is reversed in the expander. For example, the last stage of the expander is complementary to the first stage of the compressor in all respects—steady state and time dependent dynamic response (frequency, phase and transient response under all signal level and dynamic conditions).

As mentioned earlier, it is usually preferable for the high level stage to be first in a compressor series and the low-level stage to be last. However, a reversed arrangement is also possible. In the reversed case the control amplifier of the first stage needs a high gain in order to achieve the required low threshold. This low threshold then applies even in the presence of high level signals, which in the case of sliding band systems known in the prior art usually leads to poor noise modulation performance of the overall system. In this reversed arrangement each stage must provide sufficient control amplifier gain to achieve the threshold required of that stage. Moreover, each threshold is essentially fixed and independent of the operation of the other stages. This is a consequence of the fact that the signal gain of each earlier stage has fallen substantially to unity when the threshold is reached for the corresponding succeeding stage.

In contrast to the reversed situation, in the preferred arrangement (in which the high level stage is first in the compressor chain, and the low-level stage is last), there is a useful interaction between the stage gains and the thresholds. The thresholds of the downstream stages are partly determined by the signal gains of the preceding stages. Thus in a 2 stage system with 10 dB of low level gain per stage, the control amplifier gain requirement of the second stage is reduced by 10 dB, by virtue of the low-level signal gain of the first stage. When a high level signal appears, the 10 dB gain of the first stage is eliminated and the threshold of the low level stage is effectively raised by 10 dB. With sliding band companders this improves the noise modulation performance of the noise reduction action.

In the preferred arrangement the gains of all preceding stages are fully effective up to the threshold of any particular succeeding stage. Thus, in contrast with the reversed order system described above, the preferred arrangement takes best advantage of the prevailing signal gains of the individual stages. Namely:

1. Under very low level (sub-threshold) signal conditions the control amplifier gain requirement of each stage is reduced by an amount equal to the cumulative signal gains of all preceding stages.
2. A signal dependent variable threshold effect is achieved, whereby with sliding band stages, noise modulation effects are reduced. The effective thresholds of the low level stages are progressively raised with increasing signal level at a particular frequency. At high signal levels (on the high level linear portion of the transfer characteristic) the effective threshold of the lowest level stage is raised by a level equal to all the low-level (sub-threshold) stage gains up to that point.

One known embodiment of series bi-linear processors employs series sliding band devices: the compressors 2 and 4 and the expanders 6 and 8 of FIG. 2 are sliding band devices as set forth in U.S. Pat. No. Re. 28,426 with modifications thereof as described in Belgian Pat. No. 889,428. Such modifications include staggering the syllabic and overshoot thresholds and changing the filter corner frequencies.

Figure 3:
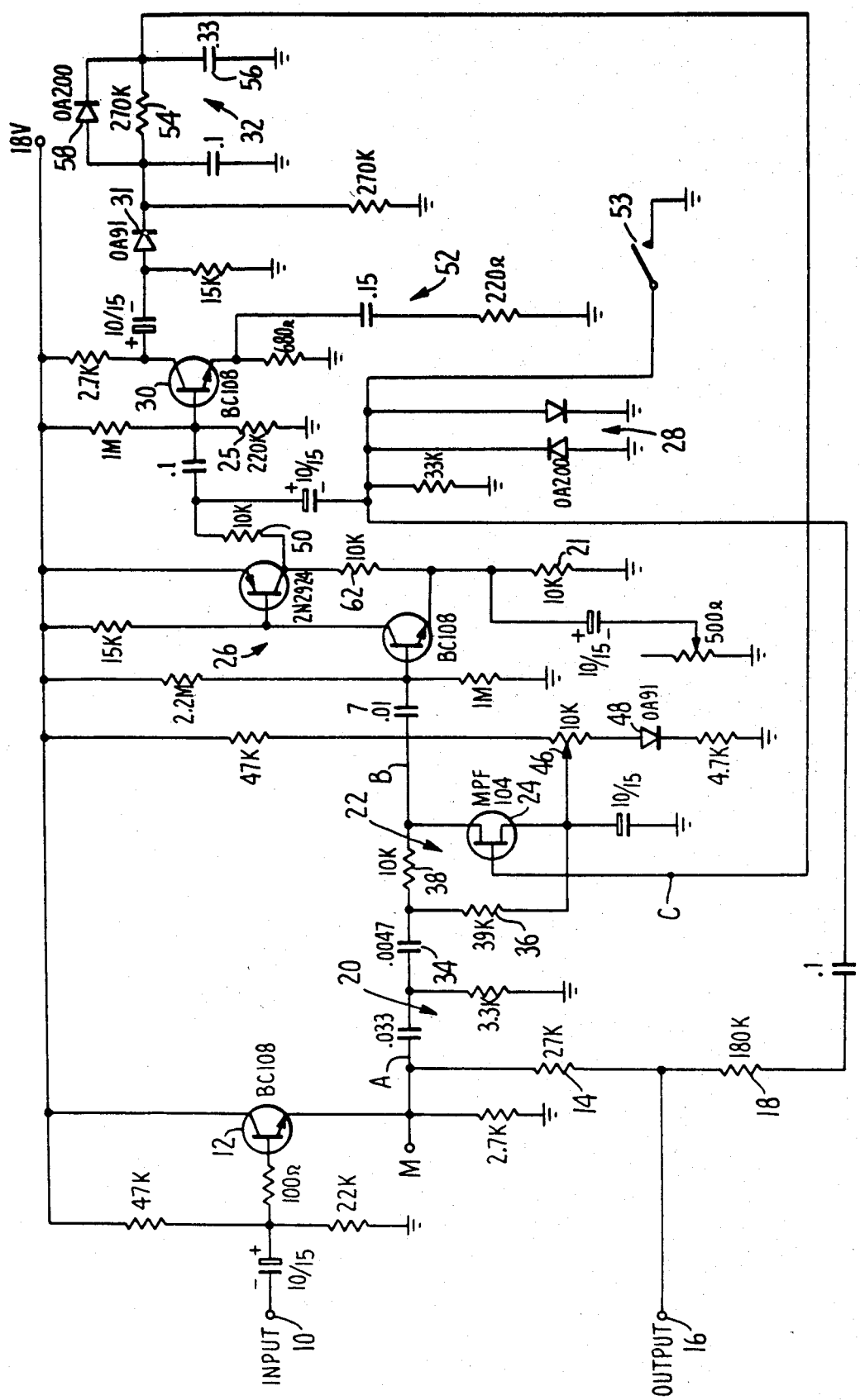
FIG. 3 is a schematic circuit diagram of a prior art sliding band compressor.
Figures 4, 5:
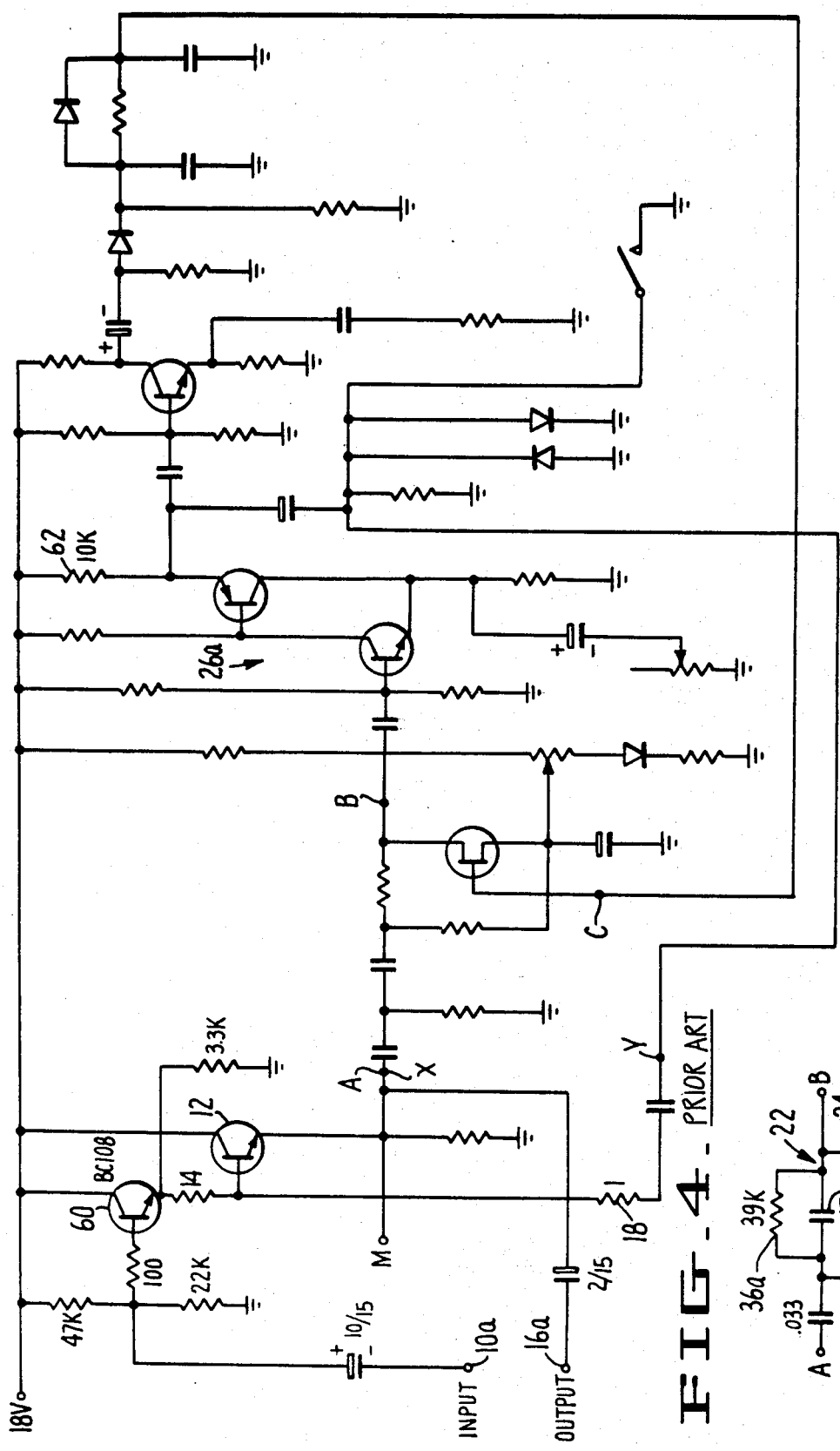
FIG. 4 is a schematic circuit diagram of a prior art sliding band expander.
FIG. 5 is a schematic circuit diagram of a modification to FIGS. 3 and 4.
Figure 10:
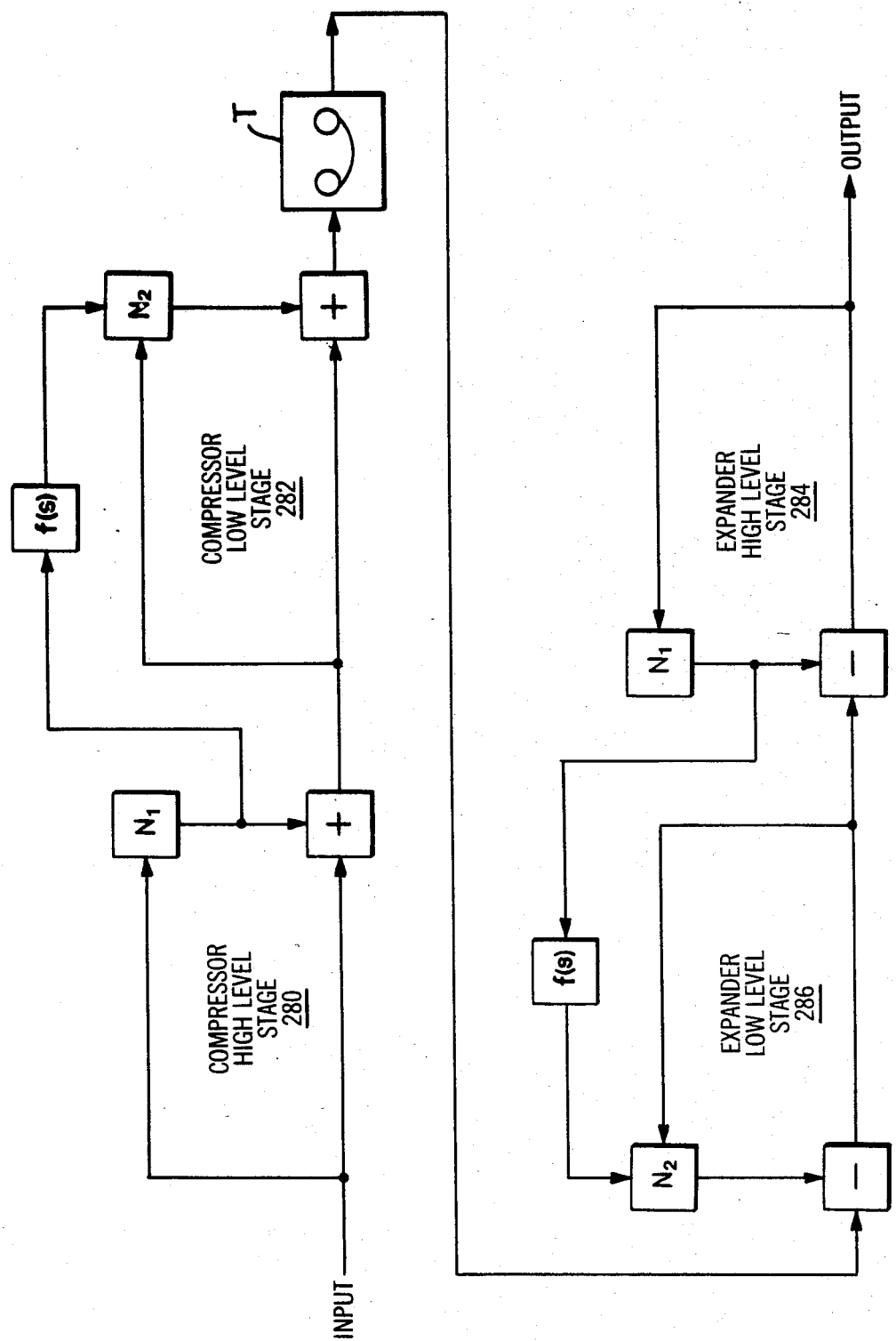
FIG. 10 is a block diagram showing the present invention embodied in a duel stage bi-linear compressor and expander.

Details of the basic circuit are set forth in FIGS. 3, 4 and 5 which are the same as FIGS. 4, 5 and 10 respectively of U.S. Pat. No. 28,426 and further details of said circuits, their operation and theory are set forth therein. The following description of FIGS. 3, 4 and 5 is taken in large part from U.S. Pat. No. Re 28,426.

The circuit of FIG. 3 is specifically designed for incorporation in the record channel of a consumer tape recorder, two such circuits being required for a stereo recorder. The input signal is applied at terminal 10 to an emitter follower stage 12 which provides a low impedance signal. This signal is applied firstly through a main, straight-through path constituted by a resistor 14 to an output terminal 16 and secondly through a further path the last element of which is a resistor 18 also connected to the terminal 16. The resistors 14 and 18 add the outputs of the main and further paths to provide the required compression law.

The further path consists of a fixed filter 20, a variable cut-off filter 22 including a FET 24 (these constituting the filter/limiter), and an amplifier 26 the output of which is coupled to a double diode limiter or clipper 28 and to the resistor 18. The non-linear limiter suppresses overshoots of the output signal with abruptly increasing input signals. The amplifier 26 increases the signal in the further path to a level such that the knee in the characteristic of the limiter or overshoot suppressor 28, comprising silicon diodes, is effective at the appropriate signal level under transient conditions. The effective threshold of the overshoot suppressor is somewhat above that of the syllabic filter/limiter. The resistors 14 and 18 are so proportioned that the required compensating degree of attenuation is then provided for the signal in the further path.

The output of the amplifier 26 is also coupled to an amplifier 30 the output of which is rectified by a germanium diode 31 and integrated by a smoothing filter 32 to provide the control voltage for the FET 24.

Two simple RC filters are used, though equivalent LC or LCR filters could be used. The fixed filter 20 provides a cut-off frequency of 1700 Hz (1500 Hz in present embodiments), below which diminishing compression takes place. The filter 22 comprises a series capacitor 34 and shunt resistor 36 followed by a series resistor 38 and the FET 24, with its source-drain path connected as a shunt resistor. Under quiescent conditions with zero signal on the gate of the FET 24, the FET is pinched off and presents substantially infinite impedance; the presence of the resistor 38 can then be ignored. The cut-off frequency of the filter 22 is thus 800 Hz (750 Hz in present embodiments), which it will be noted is substantially below the cut-off frequency of the fixed filter 20.

When the signal on the gate increases sufficiently for the resistance of the FET to fall to less than say 1K, the resistor 38 effectively shunts the resistor 36 and the cut-off frequency rises, markedly narrowing the pass band of the filter. The rise in cut-off frequency is of course a progressive action.

The use of a FET is convenient because, within a suitable restricted range of signal amplitudes, such a device acts substantially as a linear resistor (for either polarity signal), the value of which is determined by the control voltage on the gate.

The resistor 36 and FET are returned to an adjustable tap 46 in a potential divider which includes a temperature compensating germanium diode 48. The tap 46 enables the compression threshold of the filter 22 to be adjusted.

The amplifier 26 comprises complementary transistors giving high input impedance and low output impedance. Since the amplifier drives the diode limiter 28, a finite output impedance is required and is provided by a coupling resistor 50. The diodes 28 are, as already noted, silicon diodes and have a sharp knee aroung ½ volt.

The signal on the limiter and hence on the resistor 18 can be shorted to ground by a switch 53 when it is required to switch the compressor out of action.

The amplifier 30 is an NPN resistor with an emitter time constant network 52 giving increased gain at high frequencies. Strong high frequencies (e.g. a cymbal crash) will therefore lead to rapid narrowing of the band in which compression takes place, so as to avoid signal distortion.

The amplifier is coupled to the smoothing filter 32 through the rectifying diode 31. The filter comprises a series resistor 54 and shunt capacitor 56. The resistor 54 is shunted by a silicon diode 58 which allows rapid charging of the capacitor 56 for fast attack, coupled with good smoothing under steady-state conditions. The voltage on capacitor 56 is applied directly to the gate of the FET 24.

A complete circuit diagram of the complementary expander is provided in FIG. 4, but a full description is not required as substantially as the circuit is identical to FIG. 3, component values, are therefore not for the most part shown in FIG. 4.

The differences between FIGS. 3 and 4 are as follows:

In FIG. 4, the further path derives its input from the output terminal 16a, the amplifier 26a is inverting, and the signals combined by the resistors 14 and 18 are applied to the input (base) of the emitter follower 12, the output (emitter) of which is coupled to the terminal 16a. To ensure low driving impedance, the input terminal 10a is coupled to the resistor 14 through an emitter follower 60. Suitable measures must be taken to prevent bias getting in the expander.

The amplifier 26a is rendered inverting by taking the output from the emitter, instead of the collector, of the second (PNP) transistor. This alteration involves shifting the 10K resistor 62 (FIG. 3) from the collector to the emitter (FIG. 3), which automatically gives a suitable output impedance for driving the limiter. The resistor 50 is therefore omitted in FIG. 4.

It should be noted that it is important in aligning a complete noise reducton system to have equal signal levels on the emitters of the transistors 12 in both compressor and expander. Metering terminals M are shown connected to these emitters.

FIG. 5 shows a preferred circuit, for replacing the circuit between points A, B and C in FIGS. 3 and 4. When the FET 24 is pinched off, the second RC network 22 is inoperative, and the first RC network 20 then determines the response of the further path. The improved circuit combines the phase advantages of having only a single RC section under quiescent conditions with the 12 dB per octave attenuation characteristics of a two-section RC filter under signal conditions.

In the practical circuit, using MPF 104 FET's, the 39K resistor 36a is necessary in order to provide a finite source impedance to work into the FET. In this way the compression ratio at all frequencies and levels is held to a maximum of about 2. The 39K resistor 36a serves the same compression ratio limiting function in the improved circuit as the resistor 36 in the circuit of FIG. 3 or FIG. 4. In addition, this resistor provides a low frequency path for the signal.

Certain details of the circuit of FIGS. 3, 4 and 5 have evolved over the years and more modern forms of the circuit have been published and are well known in the art. Reference to the specific circuit in U.S. Pat. No. Re. 28,426 is made for convenience in presentation.

In Belgian Pat. No. 889,428 modifications to the circuit just described are disclosed, particularly for the purpose of operating two such circuits in series. These modifications include changing the frequencies of filters 20 and 22, the changing of the overshoot suppression levels, and changing the syllabic threshold of one of the circuits by modifying the control amplifier 30. This is done by altering its pre-emphasis characteristics which are controlled by emitter time constant network 52. Increasing the capacitor value in the emitter network of control amplifier 30 increases the amplifier gain at any given frequency, thus causing the sliding band filter to respond to lower signal levels. As explained above and in U.S. Pat. No. Re. 28,426, as the control voltage (from amplifier 30, rectifier 31 and smoothing filter 32) increases, the cut off frequency of the variable RC Filter 22 rises. Thus, with larger values of capacitance in network 52 (thus lowering the control amplifier turnover frequency), the variable filter responds by moving up in frequency from its quiescent value. The threshold of the overshoot suppressor is lowered by the application of suitable DC biases (in the forward direction) to the diodes 28. Alternatively, the gain of amplifier 26 (FIG. 3) can be increased to the required level or the amplifier 26 gain can be increased to a high level and attenuation used to adjust the signal level to the diodes.

Figure 6:
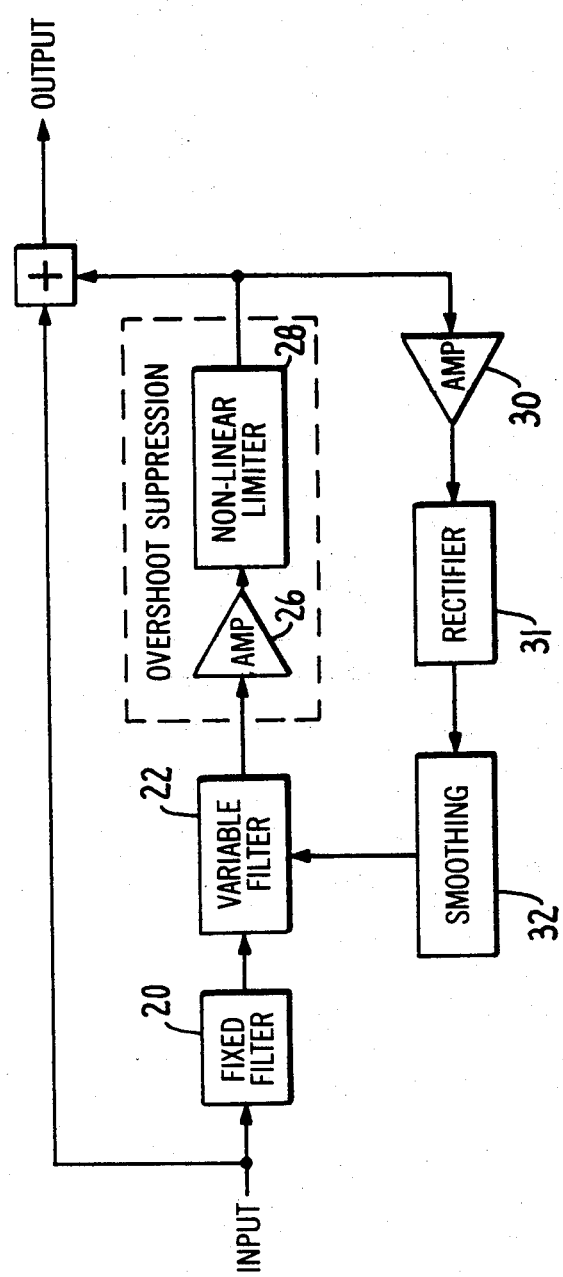
FIG. 6 is a block diagram of a dual path bi-linear sliding band compressor such as that described in connection with FIG. 3 or FIG. 3 with the modification of FIG. 5.

FIG. 6 is a block diagram of a dual path bi-linear sliding band compressor such as that described in connection with FIG. 3 or FIG. 3 with the modification of FIG. 5.

Figure 7:
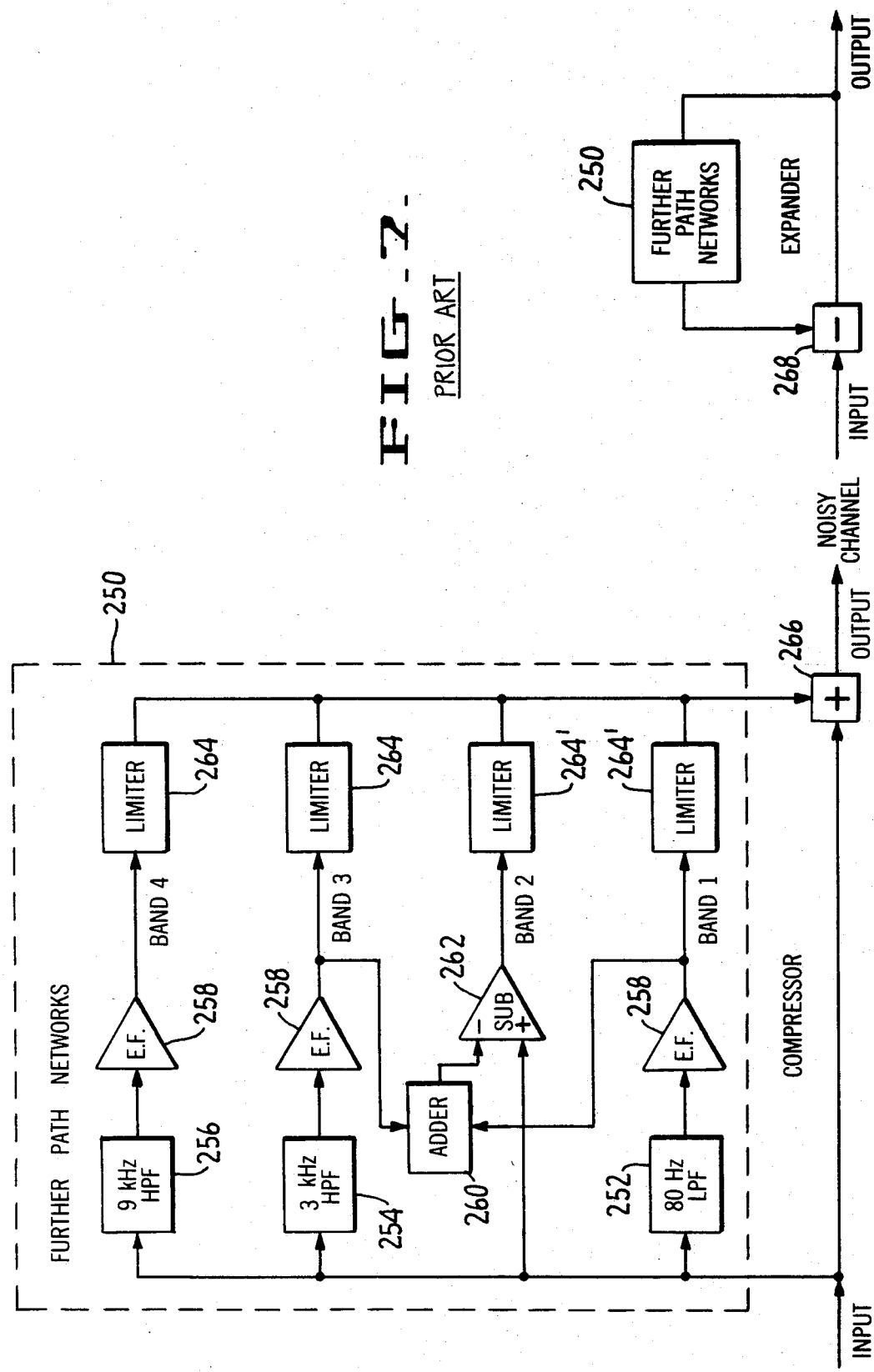
FIGS. 7 and 8 are block diagrams showing a prior art fixed band compressor and expander.

FIG. 7 shows a block diagram of a fixed band dual-path bi-linear compressor and expander configuration. The fundamental aspects of this system is disclosed in U.S. Pat. No. 3,846,719, U.S. Pat. No. 3,903,485 and in *Journal of the Audio Engineering Society*, Vol. 15, No. 4, October 1967, pp. 383-388.

In the known embodiment of FIG. 7, the further path networks 250 provide four bands. Bands 1, 3 and 4 have conventional 12 dB/octave input filters: an 80 Hz low pass filter 252 at the input of band 1, a 3 kHz high pass filter 254 at the input of band 3 and a 9 kHz high pass filter 256 at the input of band 4. Each is followed by an emitter follower isolation stage 258. Band 2 has a frequency response which is complementary to that of bands 1 and 3. Such a response is derived by adding (in adder 260) the outputs of the emitter followers 258 in bands 1 and 3 and subtracting that sum from the overall input signal (in subtractor 262). The output of emitter follower 258 in each band and the output of subtractor 262 are applied to respective limiters. Limiters 264' in bands 1 and 2 have time constants twice those in bands 3 and 4. The outputs of bands 1-4 are combined with the main path signal in combiner 266. The compressor output is applied to a noisy channel for transmission to the complementary expander in which the output of the identical further path networks are subtracted from the input signal to provide the complementary expansion characteristic.

Figure 8:
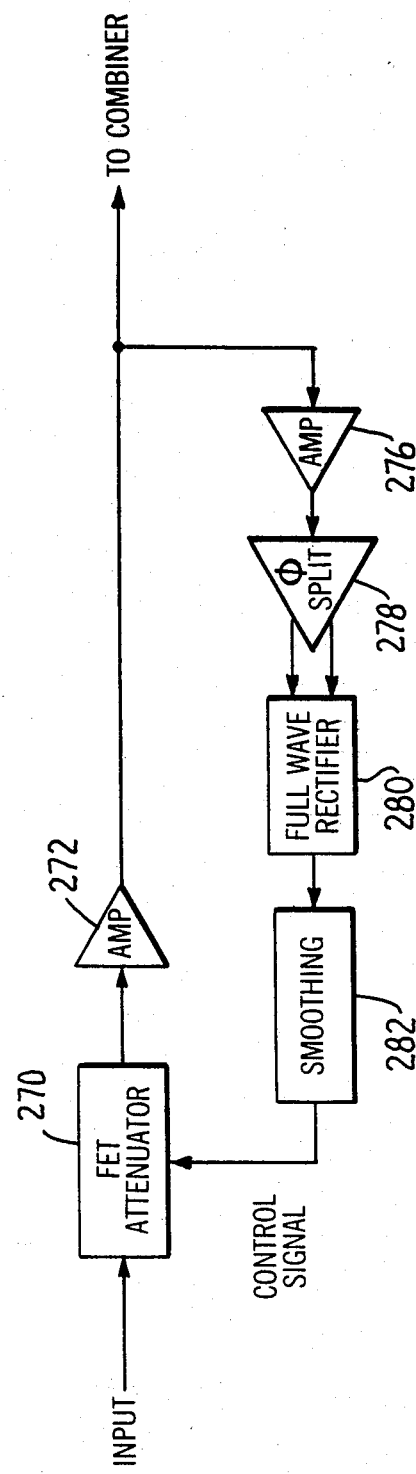

FIG. 8 shows further details of the limiters 264 and 264'. Each includes an FET attenuator 270 that operates in response to a control signal. The attenuator output is amplified by signal amplifier 272, the gain of which is set to provide the desired low level signal gain. The outputs of all the bands are combined with the main signal in such a way as to produce a low level output from the compressor which is uniformly 10 dB higher than the input signal up to about 5 kHz, above which the increase in level rises smoothly to 15 dB at 15 kHz.

The FET attenuator is controlled by a control signal sub-circuit that provides a compression threshold of 40 dB below peak operating level. The control sub-circuit includes control signal amplifier 276 followed by a phase splitter 278 which drives a full wave rectifier 280. The resulting DC is applied to a smoothing network 282 the output of which is the control signal. Network 282 includes an RC pre-integrator, an emitter follower and a final RC integrator that operate in conjunction with diodes such that both the pre- and final integrators have non-linear characteristics produced by the diodes. Fast, large changes in signal amplitude are passed quickly, whereas small changes are transferred slowly. This dynamic smoothing action produces optimum results with respect to modulation effects, low frequency distortion, and distortion components generated by the control signal. The circuit achieves both fast recovery and low signal distortion.

Figure 9:
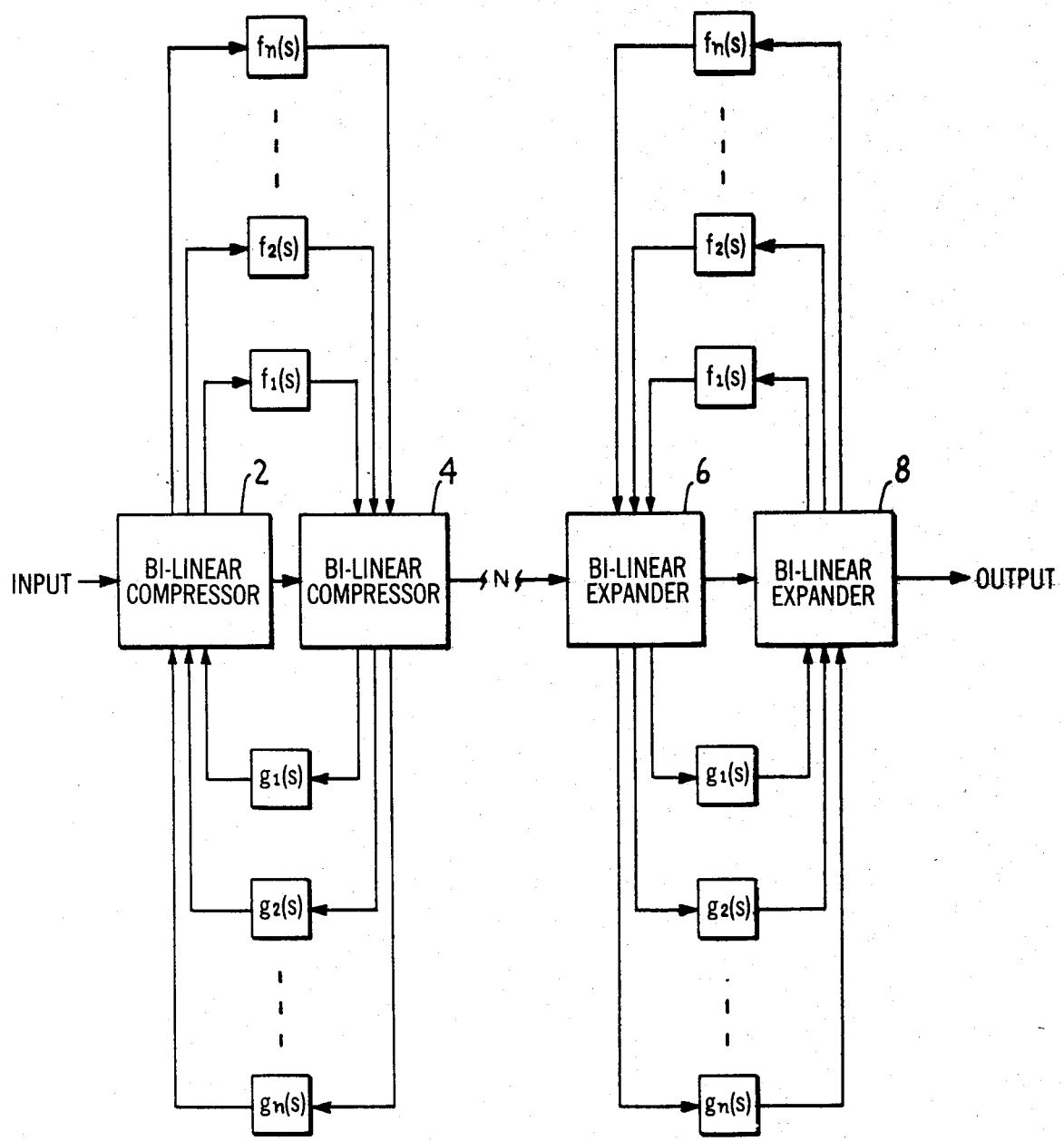
FIG. 9 is a block diagram showing the present invention in general terms.

FIG. 9 shows generally the possible cross-coupling configurations between two series bi-linear devices. If more than two devices are operated in series, the possible cross-coupling configurations increases. Thus, for example, the first device may be cross-coupled to the third device, and so on. Referring to FIG. 9, "n" possible cross-couplings from compressor 2 to compressor 4 are shown, having respective transfer functions $f_1(s)$, $f_2(s)$ to $f_n(s)$. Also, "n" possible cross-couplings from compressor 4 to compressor 2 are shown, having respective transfer functions $g_1(s)$, $g_2(s)$ to $g_n(s)$. In the complementary expander arrangement of expanders 6 and 8, the cross-couplings are reversed such that the $g_1(s)$, $g_2(s)$ and $g_n(s)$ cross-couplings are from expander 6 to expander 8 and the $f_1(s)$, $f_2(s)$ and $f_n(s)$ cross-couplings are from expander 8 to expander 6. Thus, in general, there may be one or more cross-couplings, either forward or backward [f(s) or g(s)] and the cross-coupling(s) may be in only one direction (e.g., either the f(s) or g(s) directions are omitted) or, alternatively, may be in both directions via a single coupling means.

The transfer functions $f_1(s)$, $f_2(s)$, $g_1(s)$, etc., may be implemented by various active or passive devices which may include frequency and/or level dependent elements. The input and output connections of the cross-coupling paths may include suitable points for deriving from or coupling to any of the following: input signals, output signals, main path signals (in a dual-path bi-linear device), further path signals (in a dual-path bi-linear device), the AC input signals to the control circuit(s), or the DC control circuit signals themselves (the latter two in bi-linear circuits where compression or expansion is effected by a controllable element responding to a control signal sub-circuit).

In FIG. 10, an exemplary cross-coupling arrangement is shown between the further paths of dual path bi-linear compressors and expanders. The series devices are arranged such that the syllabic threshold of the first compressor circuit is at a higher level than the second compressor circuit. For complementarity, the order is reversed in the series expander circuits. Blocks $N_1$ and $N_2$ denote the further path circuitry. In the arrangement of FIG. 10 the output of the high level stage 280 further path from $N_1$ is applied through coupling circuitry having a transfer function f(s) into the circuitry of the further path circuit $N_2$ of low level stage 282. The transfer function f(s) may have suitable frequency and phase characteristics so as to enhance the limiting action of the low level compressor stage and consequently, the noise reduction effect. If the bi-linear devices are sliding band devices the signal from the high level stage is injected, for example, in the filter circuitry of the low level stage in order to enhance the sliding band action. In the complementary expander the output from $N_1$ in the high level expander stage is applied through the same transfer characteristic f(s) to the circuitry of the low level stage further path circuit $N_2$.

Figure 11:
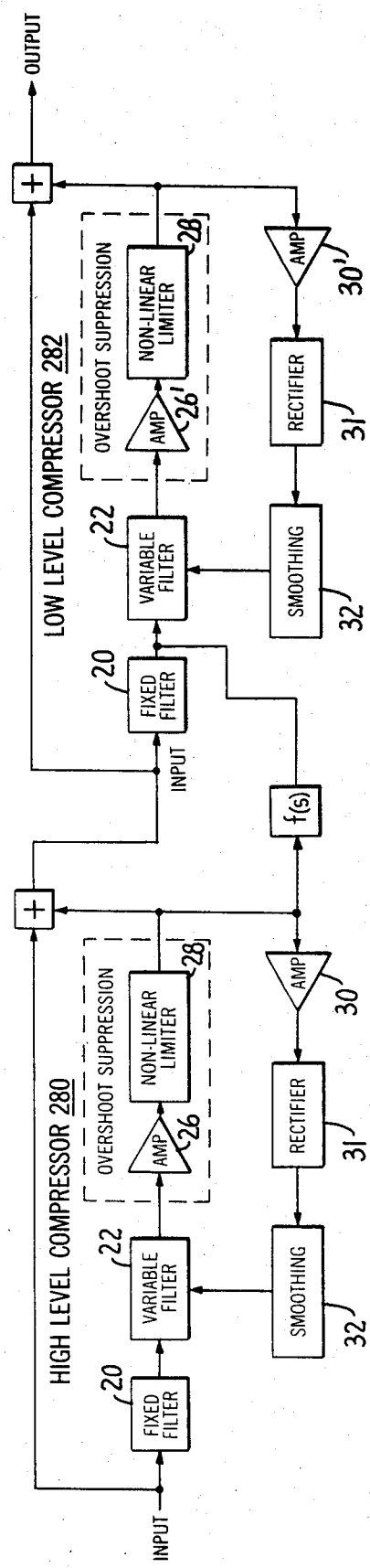
FIG. 11 is a more detailed block diagram of the embodiment of FIG. 10.
Figure 12:
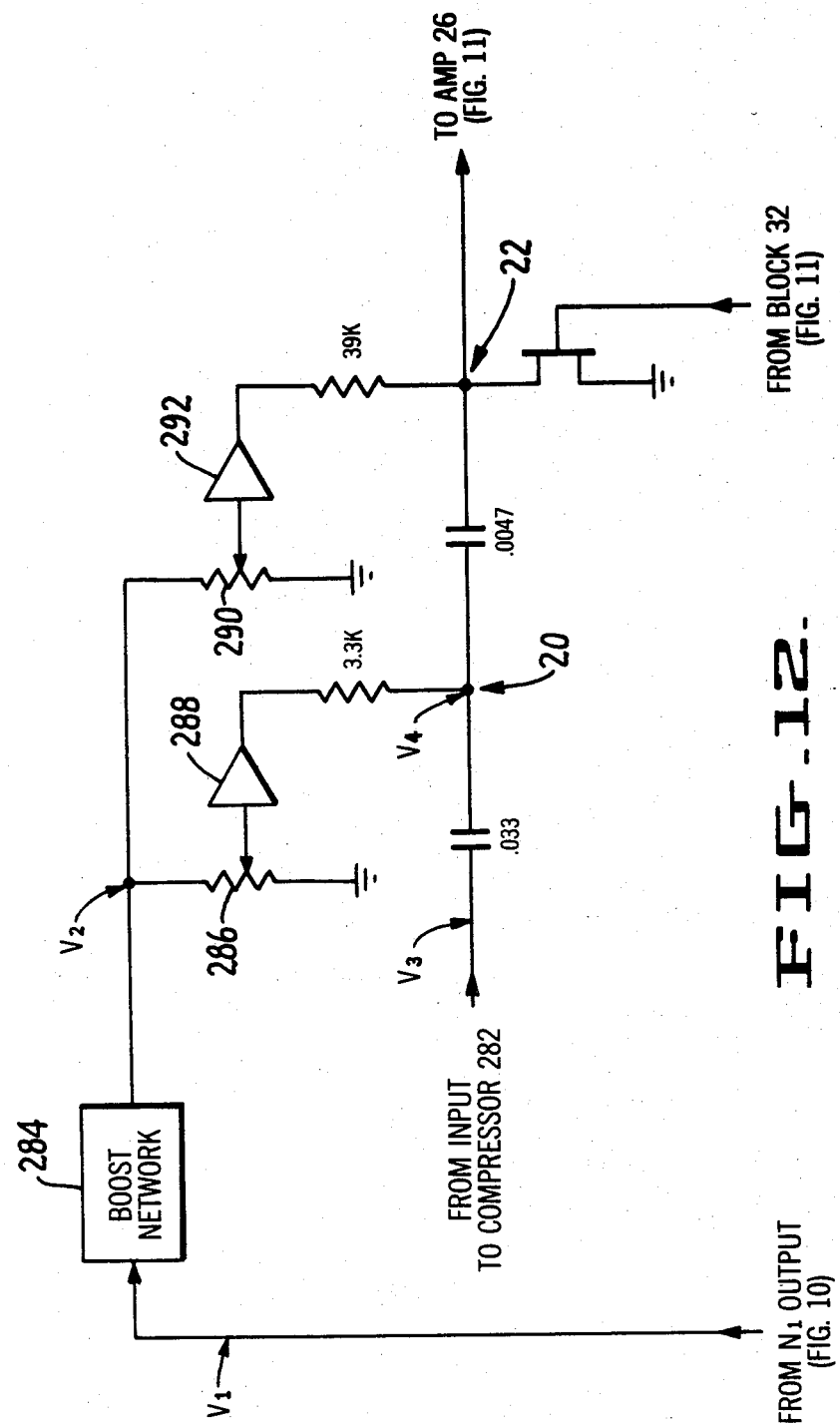
FIG. 12 is a schematic diagram showing an exemplary cross-coupling network for use in the embodiment of FIG. 11.

A specific embodiment of the general arrangement of FIG. 10 is shown in FIGS. 11 and 12. FIG. 11 shows the series compressor circuits 280 and 282, indicating the input and output connection points for the cross-coupling that includes the transfer function f(s). FIG. 12 shows the details of the transfer function f(s) network and its connection to the filter circuitry of compressor 282. For convenience, the filter circuitry of compressor 282 is taken to be as described in connection with FIG. 5.

The cross-coupling network of FIG. 12 includes a high frequency boost network 284 that provides a 10 dB boost at high frequencies and having an corner frequency equal to the quiescent filter corner frequency of circuit 280. The network 284 output is split into two paths and injected via adjustable gain means into the fixed filter 20 and the variable filter 22. One end of the 3.3 K resistor in fixed filter 20 is lifted from ground and the signal derived via potentiometer 286 and amplifier 288 is then applied. The end of the 39 K resistor 36a that was formerly connected at the junction of the 0.033 capacitor and the 3.3 K resistor is lifted from that junction and the signal derived via potentiometer 290 and amplifier 292 is applied thereto. Amplifier 288 has a gain of about ¾ and amplifier 292 has a gain of unity.

In operation, at low levels, the high level circuit 280 would not yet operate. Under this condition voltage $V_2$ equals voltage $V_4$, because voltage $V_3$ contains a low level high frequency boost (resulting from the below threshold gain of high level circuit 280) which is matched by the boost network 284. The signal levels applied to the fixed filter 20 and variable filter 22 may be adjusted to obtain the best results. If about ¾ of the network 284 output signal is fed to the 3.3 K resistor, its effective resistance becomes about 13 K. When the high level circuit reaches its threshold, both filters (20 and 22) in the low level circuit 282 would then have a sliding band action that would improve the overall noise modulation performance without exacerbating mid-band modulation effects, i.e. excessive band sliding is minimized.

Figure 13:
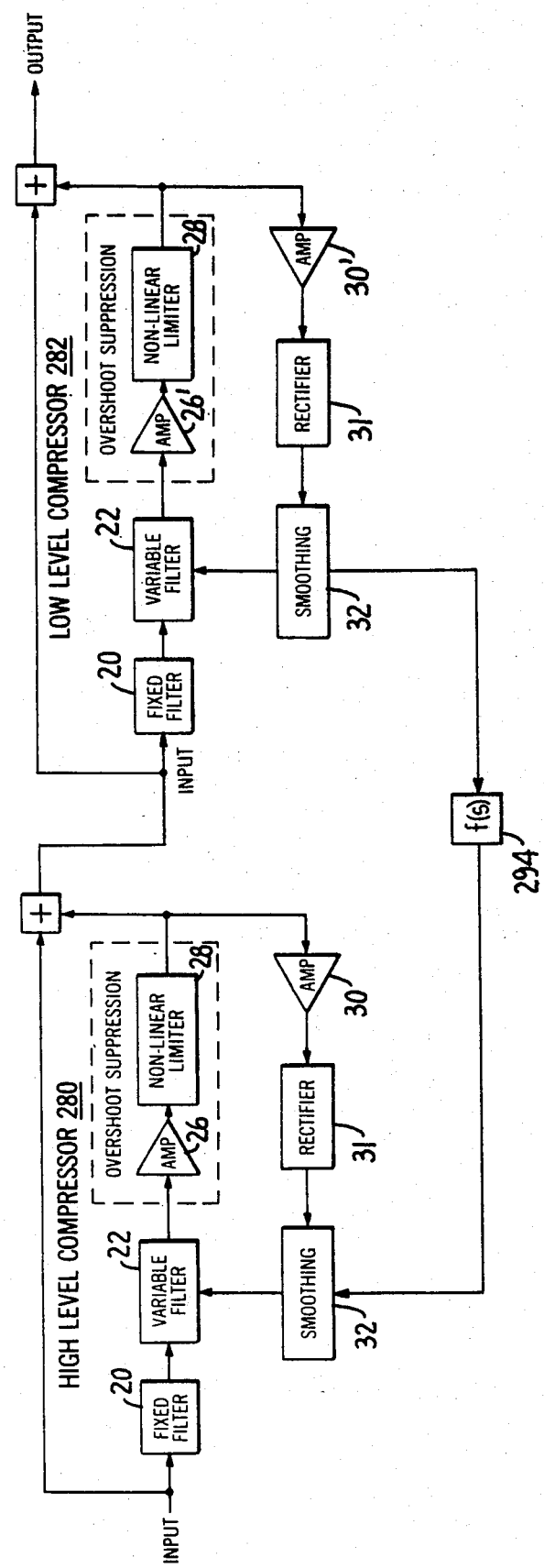
FIG. 13 is a block diagram showing a further embodiment of the invention.

FIG. 13 shows generally an arrangement for cross-coupling control signal components from one series device to another. In the example of FIG. 13, a control signal component from smoothing network 32 of the low level compressor 232 is applied via transfer function f(s) block 294 to the smoothing network 32 of the high level stage 22.

In operation, the low level circuit 282 has the first and largest response to incoming transients and thus, the cross-coupled signal provides the high level processor with a timely warning of impending signal amplitude changes.

Figure 14:
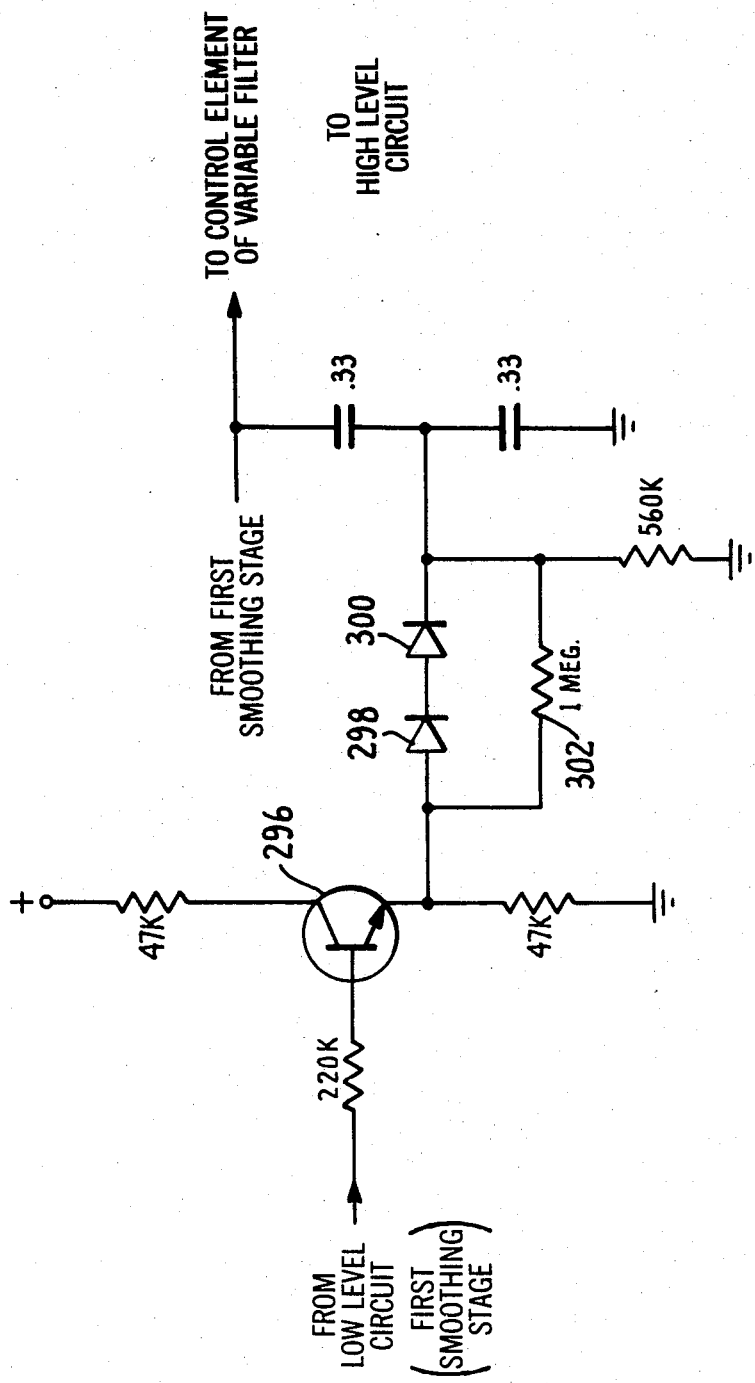
FIG. 14 is a schematic diagram showing an exemplary cross-coupling network for use in the embodiment of FIG. 13.

One suitable cross-coupling transfer function f(s) is provided by the network shown in FIG. 14, which includes an emitter follower 296 which drives series diodes 298, 300 in parallel with a resistor 302. A 560 K resistor is connected between the cathode of diode 300 and ground. The emitter follower has a 220 K resistor in its base input that is driven from the input of the first smoothing stage of the low level circuit. Thus, the input signal is essentially a pulse from rectifier 31 that is not delayed by time constants in the low level smoothing stage. The pulse is AC coupled by the emitter follower stage, which can provide adequate current dumping, into the output filter section of the high level stage smoothing network, thus providing a fast additional control signal component.

Figure 15:
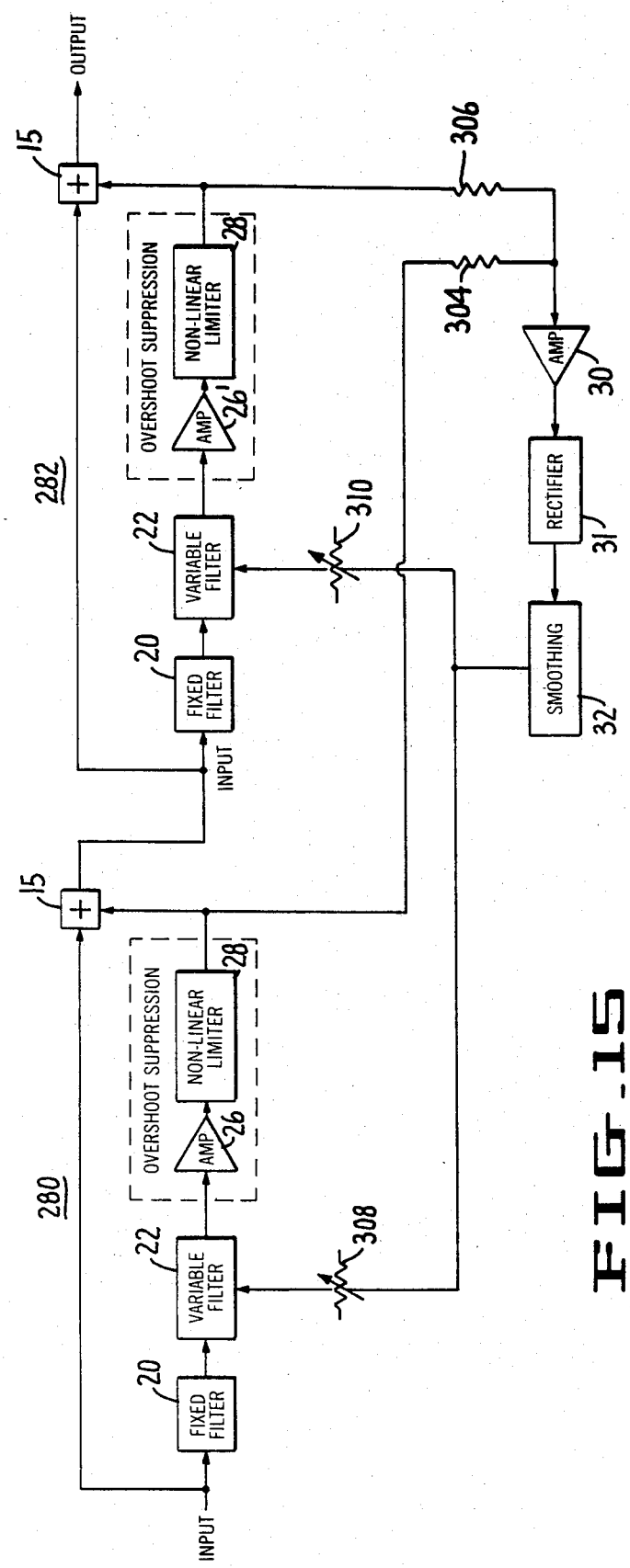
FIG. 15 is a block diagram showing the invention embodied in an arrangement for providing a common control circuit to series connected sliding band bi-linear devices.

In FIG. 15, a further embodiment of the invention for cross-coupling series sliding band dual-path devices is shown. Elements common to the embodiment of FIG. 11 retain the same reference numerals. According to the embodiment of FIG. 15, a single control circuit (blocks 30, 31, 32) is fed by adder resistors 304 and 306 from the outputs of the further paths in each of the series compressors 280 and 282. The control circuit output is applied to the variable filter 22 of each series compressor through respective level setting means 308 and 310 (if required). The values of adder resistors 304 and 306 may be selected to weight the controlling effect of one compressor with respect to another. The arrangement provides an economy in circuit components, while providing performance in large part similar to configurations employing individual control circuits for each series device. A single control circuit may also be provided for the case of three or more series connected compressors or expanders, in which case each further path output is fed through a summing resistor to the control circuit input, the output of which is applied through respective level setting means (if required) to the respective variable filters.

Figure 16:
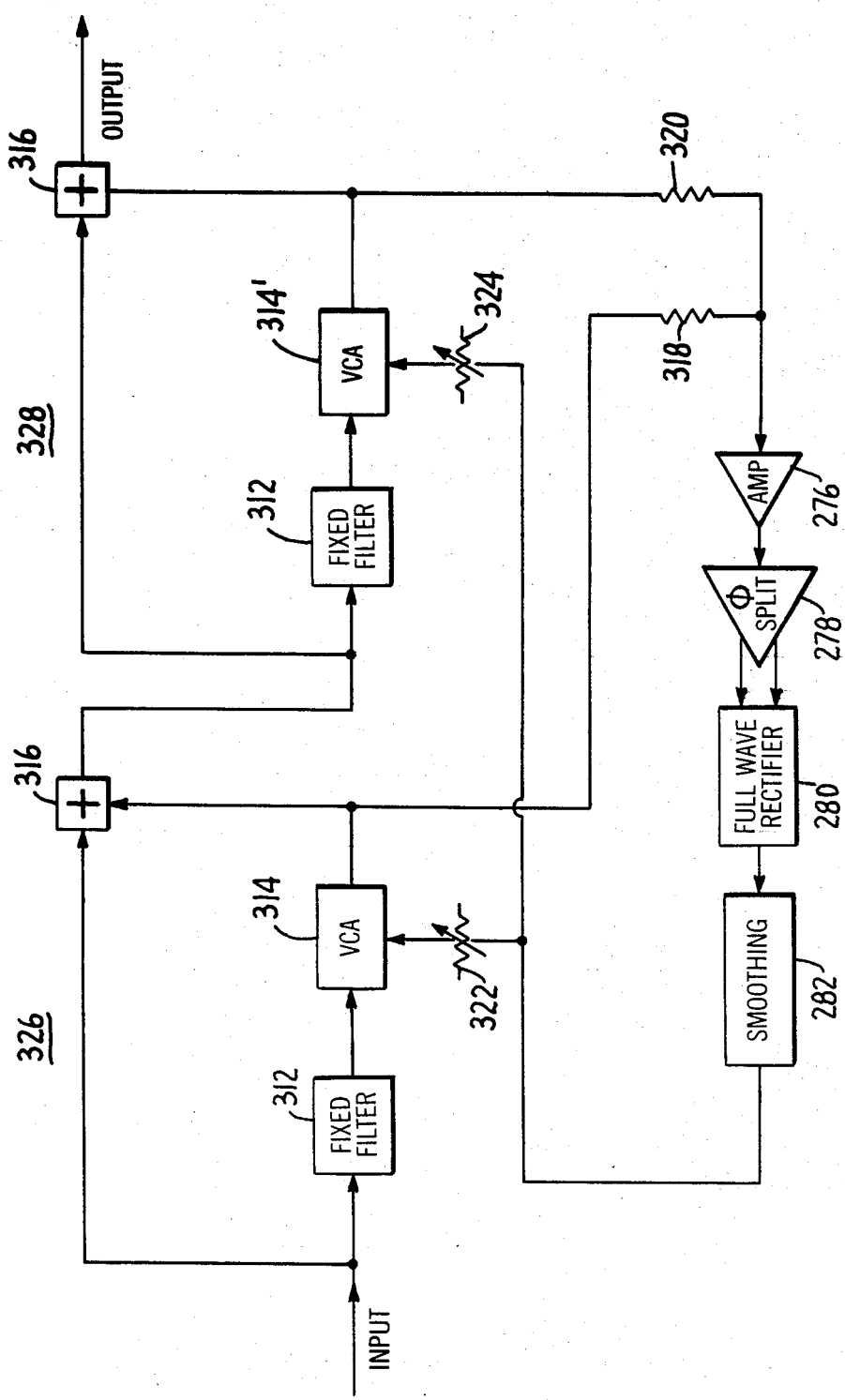
FIG. 16 is a block diagram showing the invention embodied in an arrangement for providing a common control circuit to series connected fixed band bi-linear devices.

A single control circuit arrangement is also applicable to fixed band series connected devices as shown in the embodiment of FIG. 16, in which fixed band compressors having a single further path are shown. The arrangement is also applicable to series fixed band compressors and expanders each having a plurality of further paths, in which case the common control circuit is, of course, connected between or among the further paths operating in the same frequency band.

Referring to FIG. 16, the input signal is split in compressor 326 into a main path which is applied to a combining network 316 and to a further path that includes a fixed filter 312 and a voltage controlled amplifier (VCA) 314. The VCA may be an FET attenuator followed by an amplifier such as described in connection with FIG. 8 (blocks 270 and 272). In the second compressor 328, the threshold of VCA 314' is staggered with respect to VCA 314 in the first compressor 326, as explained in Belgian-Pat. No. 889,428. A common control circuit (blocks 276, 278, 280 and 282, as described in connection with FIG. 8), is fed by summing resistors 318 and 320 from the further path output in the manner of the FIG. 15 embodiment. The control circuit output is applied to the VCA's 314 and 314' through level adjusting means 322 and 324. The arrangement is also applicable to three or more series fixed band devices in the same way as mentioned in connection with the embodiment of FIG. 15.

The embodiments of FIGS. 15 and 16 are both based on the observation that in such series connected compressors and expanders, the dynamic action occurs primarily in one stage at a time. For example, starting at low input signal levels, the lowest level stage generates most of the combined control signal. As the input signal level rises the lowest level stage phases out of dynamic action and the next higher threshold level stage becomes active and contributes most of the combined control signal.

What is claimed is:

1. A circuit for modifying the dynamic range of an input signal, comprising
   first circuit means with a bi-linear characteristic composed of a low level portion of substantially constant gain up to a threshold, an intermediate level portion, above the threshold, of changing gain providing a maximum compression ratio or expansion ratio, and a high level portion of substantially constant gain different from the gain of the low level portion,
   at least one second circuit means, which also has a bilinear characteristic within a frequency range common to the circuit means, in series with the first circuit means thereby to provide an overall characteristic which is also bi-linear, the intermediate level portions of the characteristics of the circuit means being staggered within a frequency range common to the circuit means such as to provide a change of gain over a wider range of intermediate input levels than for any of the circuit means individually, and an increased difference between the gains at low and high input levels, but with an overall maximum compression or expansion ratio which is substantially no greater than that of any single circuit means, by virtue of the staggering, and
   at least one coupling circuit means coupling signal components from one of the circuit means to another of the circuit means for modifying the action of the said other circuit means in response to coupled signal components from said one circuit means.

2. The circuit arrangement of claim 1 wherein said coupling circuit means includes means for processing coupled signal components.

3. The circuit arrangement of claim 2 wherein said means for processing includes frequency and/or level dependent elements.

4. The circuit arrangement of claims 1 or 2 wherein said at least one coupling circuit means comprises a common control circuit for controlling the dynamic action of said circuit means.

5. The circuit arrangement of claim 4 wherein said common control circuit derives a control signal from signal components from each of said circuit means.

6. The circuit arrangement of claims 1 or 2 wherein each of the circuit means between or among which the coupling circuit means couples or couple signal components comprise a variable gain or variable pass filter circuit and a control circuit which derives a control signal for the said variable circuit, the coupling circuit means coupled from the control circuit of the said one circuit means to the control circuit in the said other circuit means for modifying the control signal of said other circuit means.

7. The circuit arrangement of claims 1 or 2 wherein each of the circuit means between or among which the coupling circuit means couples or couple signal components comprises a main signal path having a linear characteristic with respect to dynamic range, a combining circuit in the main signal path, and a further path having a non-linear characteristic with respect to dynamic range and having its input coupled to the input or output of the main signal path and its output coupled to the combining circuit which combines the signal from the further path additively or subtractively with the signal in the main path, said at least one coupling circuit means coupled from the output of the further path of the said one circuit means to the further path of the said other circuit means.

8. A circuit for modifying the dynamic range of an input signal, comprising first circuit means having a characteristic in which only a portion thereof has a changing gain between low and high input levels, at least one second circuit means which also has such a characteristic within a frequency range common to the circuit means, in series with the first circuit means, the changing gain portions of the characteristics of the circuit means being staggered within a frequency range common to the circuit means such as to provide a change of gain over a wider range of input levels than for any one of the circuit means individually, and an increased difference between the gains at low and high input levels, but with a maximum overall compression or expansion ratio which is substantially no greater than that of any single circuit means, by virtue of the staggering, and at least one coupling circuit means coupling signal components from one of the circuit means to another of the circuit means for modifying the action of the said other circuit means in response to coupled signal components from said one circuit means.

9. The circuit arrangement of claim 8 wherein said coupling circuit means includes means for processing coupled signal components.

10. The circuit arrangement of claim 9 wherein said means for processing includes frequency and/or level dependent elements.

11. The circuit arrangement of claims 8 or 9 wherein said at least one coupling circuit means comprises a common control circuit for controlling the dynamic action of said circuit means.

12. The circuit arrangement of claim 11 wherein said common control circuit derives a control signal from signal components from each of said circuit means.

13. The circuit arrangement of claims 8 or 9 wherein each of the circuit means between or among which the coupling circuit means couples or couple signal components comprise a variable gain or variable pass filter circuit and a control circuit which derives a control signal for the said variable circuit, the coupling circuit means coupled from the control circuit of the said one circuit means to the control circuit in the said other circuit means for modifying the control signal of said other circuit means.

14. The circuit arrangement of claims 8 or 9 wherein each of the circuit means between or among which the coupling circuit means couples or couple signal components comprises a main signal path having a linear characteristic with respect to dynamic range, a combining circuit in the main signal path, and a further path having a non-linear characteristic with respect to dynamic range and having its input coupled to the input or output of the main signal path and its output coupled to the combining circuit which combines the signal from the further path additively or subtractively with the signal in the main path, said at least one coupling circuit means coupled from the output of the further path of the said one circuit means to the further path of the said other circuit means.

* * * * *